United States Patent
Jung

(10) Patent No.: US 9,401,215 B2
(45) Date of Patent: Jul. 26, 2016

(54) NONVOLATILE MEMORY DEVICE AND METHOD FOR DRIVING THE SAME

(71) Applicant: Bong-Kil Jung, Suwon-si (KR)

(72) Inventor: Bong-Kil Jung, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/591,438

(22) Filed: Jan. 7, 2015

(65) Prior Publication Data

US 2016/0035428 A1 Feb. 4, 2016

(30) Foreign Application Priority Data

Aug. 1, 2014 (KR) .................. 10-2014-0099104

(51) Int. Cl.

| | |
|---|---|
| *G11C 16/14* | (2006.01) |
| *G11C 16/32* | (2006.01) |
| *G11C 16/16* | (2006.01) |
| *G11C 16/04* | (2006.01) |
| *G11C 16/34* | (2006.01) |
| *G11C 11/56* | (2006.01) |

(52) U.S. Cl.
CPC .............. *G11C 16/16* (2013.01); *G11C 16/32* (2013.01); *G11C 11/5635* (2013.01); *G11C 16/0483* (2013.01); *G11C 16/14* (2013.01); *G11C 16/3445* (2013.01)

(58) Field of Classification Search
CPC .... G11C 16/14; G11C 16/32; G11C 16/0483; G11C 16/16
USPC ................ 365/185.11, 185.23, 185.29
See application file for complete search history.

(56) References Cited

U.S. PATENT DOCUMENTS

| | | | | |
|---|---|---|---|---|
| 4,327,410 | A * | 4/1982 | Patel ................... | G06F 11/1441 365/228 |
| 5,729,169 | A * | 3/1998 | Roohparvar ........... | H03K 3/355 327/174 |
| 6,279,070 | B1 | 8/2001 | Jeong et al. | |
| 6,633,950 | B1 | 10/2003 | Brown et al. | |
| 7,164,610 | B2 | 1/2007 | Kimura et al. | |
| 7,236,405 | B2 | 6/2007 | Ueda | |
| 7,562,180 | B2 | 7/2009 | Gyl et al. | |
| 7,706,186 | B2 | 4/2010 | Shinozaki | |
| 8,364,888 | B2 | 1/2013 | Melik-Martirosian et al. | |
| 8,559,236 | B2 | 10/2013 | Nakai et al. | |
| 2011/0055453 | A1* | 3/2011 | Bennett ................ | G11C 16/10 711/103 |
| 2012/0069673 | A1* | 3/2012 | Backhausen .......... | G11C 16/10 365/185.19 |
| 2013/0198451 | A1* | 8/2013 | Hyun ................... | G11C 16/225 711/114 |
| 2014/0215175 | A1* | 7/2014 | Kasorla ................ | G06F 12/00 711/167 |
| 2015/0186042 | A1* | 7/2015 | Lee ...................... | G06F 3/061 711/103 |

* cited by examiner

*Primary Examiner* — Ly D Pham

(74) *Attorney, Agent, or Firm* — Volentine & Whitt, PLLC

(57) ABSTRACT

A method for driving a nonvolatile memory device includes performing an erase operation with respect to a plurality of memory cells, stopping the erase operation by a suspend command, calculating a residual time of the erase operation that has not yet been performed, performing a first operation, comparing a first vacant time between a completion time point of the first operation and a start time point of a second operation with the residual time, performing the erase operation that has not yet been performed if the residual time is equal to or shorter than the first vacant time, and performing the second operation if the residual time is longer than the first vacant time.

17 Claims, 19 Drawing Sheets

[ ERASE OPERATION ]

[ PROGRAM OPERATION ]

NONVOLATILE MEMORY DEVICE AND METHOD FOR DRIVING THE SAME

CROSS-REFERENCE TO RELATED APPLICATIONS

A claim of priority is made to Korean Patent Application No. 10-2014-0099104, filed on Aug. 1, 2014 in the Korean Intellectual Property Office, the disclosure of which is incorporated herein in its entirety by reference.

BACKGROUND

The present inventive concept relates to a nonvolatile memory device and a method for driving the same.

A semiconductor memory device is a storage device that is implemented using a semiconductor such as silicon (Si), germanium (Ge), gallium arsenide (GaAs), and/or indium phosphide (InP). Each semiconductor memory device is generally categorized as either a volatile memory device or a nonvolatile memory device.

A volatile memory device is a memory device in which stored data is lost when a power supply thereto is interrupted, and examples thereof include an SRAM (Static RAM), a DRAM (Dynamic RAM), a SDRAM (Synchronous DRAM), and the like. In contrast, a nonvolatile memory device is a memory device in which stored data is retained even when a power supply thereto is interrupted, and examples thereof include a flash memory device, a ROM (Read Only Memory), a PROM (Programmable ROM), an EPROM (Electrically Programmable ROM), an EEPROM (Electrically Erasable and Programmable ROM), and a resistive memory (e.g., a PRAM (Phase-change RAM), a FRAM (Ferroelectric RAM), and a RRAM (Resistive RAM)).

SUMMARY

In accordance with an aspect of the inventive concept, there is provided a method for driving a nonvolatile memory device including performing an erase operation with respect to a plurality of memory cells, stopping the erase operation by a suspend command, calculating a residual time of the erase operation that has not yet been performed, performing a first operation, comparing a first vacant time between a completion time point of the first operation and a start time point of a second operation with the residual time; and performing the erase operation that has not yet been performed if the residual time is equal to or shorter than the first vacant time, and performing the second operation if the residual time is longer than the first vacant time.

In accordance with another aspect of the inventive concept, there is provided a method for driving a nonvolatile memory device including performing an erase operation with respect to a plurality of memory cells, stopping the erase operation by a suspend command, calculating a residual time of the erase operation that has not yet been performed, and sequentially performing first to third operations that are different from the erase operation, wherein if the residual time is equal to or shorter than a time between the first operation and the second operation, the erase operation that has not yet been performed is performed before the second operation is performed, while if the residual time is equal to or shorter than a time between the second operation and the third operation, the erase operation that has not yet been performed is performed before the third operation is performed.

In accordance with yet another aspect of the inventive concept, there is provided a nonvolatile memory device which includes a memory device including a plurality of blocks each of which includes a plurality of memory cells, and a memory controller controlling the memory device in accordance with a request from a host. If a suspend command is received from the host while an erase operation is performed with respect to at least one of the plurality of blocks, the memory controller stops the erase operation and calculates a residual time of the erase operation that has not yet been performed during the erase operation. The memory controller sequentially performs a first operation and a second operation, compares a vacant time between the first operation and the second operation with the residual time, performs the erase operation that has not yet been performed before performing the second operation if the residual time is shorter than the vacant time, and performs the erase operation that has not yet been performed after the second operation if the residual time is longer than the vacant time.

BRIEF DESCRIPTION OF THE DRAWINGS

The above and other objects, features and advantages of the present inventive concept will be more apparent from the following detailed description taken in conjunction with the accompanying drawings, in which.

DETAILED DESCRIPTION OF THE EMBODIMENTS

Figure 1:
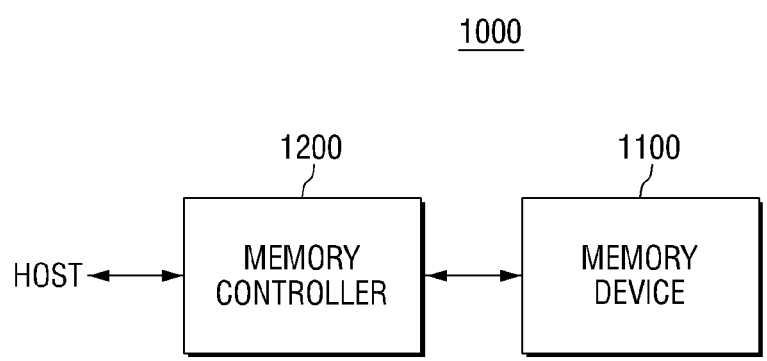
FIG. 1 is a block diagram for reference in describing a nonvolatile memory device according to some embodiments of the present inventive concept.

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will filly convey the scope of the inventive concept to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

The present inventive concept will be described with reference to perspective views, cross-sectional views, and/or plan views, in which preferred embodiments of the inventive concept are shown. Thus, the profile of an exemplary view may be modified according to manufacturing techniques and/or allowances. That is, the embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Hereinafter, preferred embodiments of the present inventive concept will be described with reference to the accompanying drawings.

Figure 2:
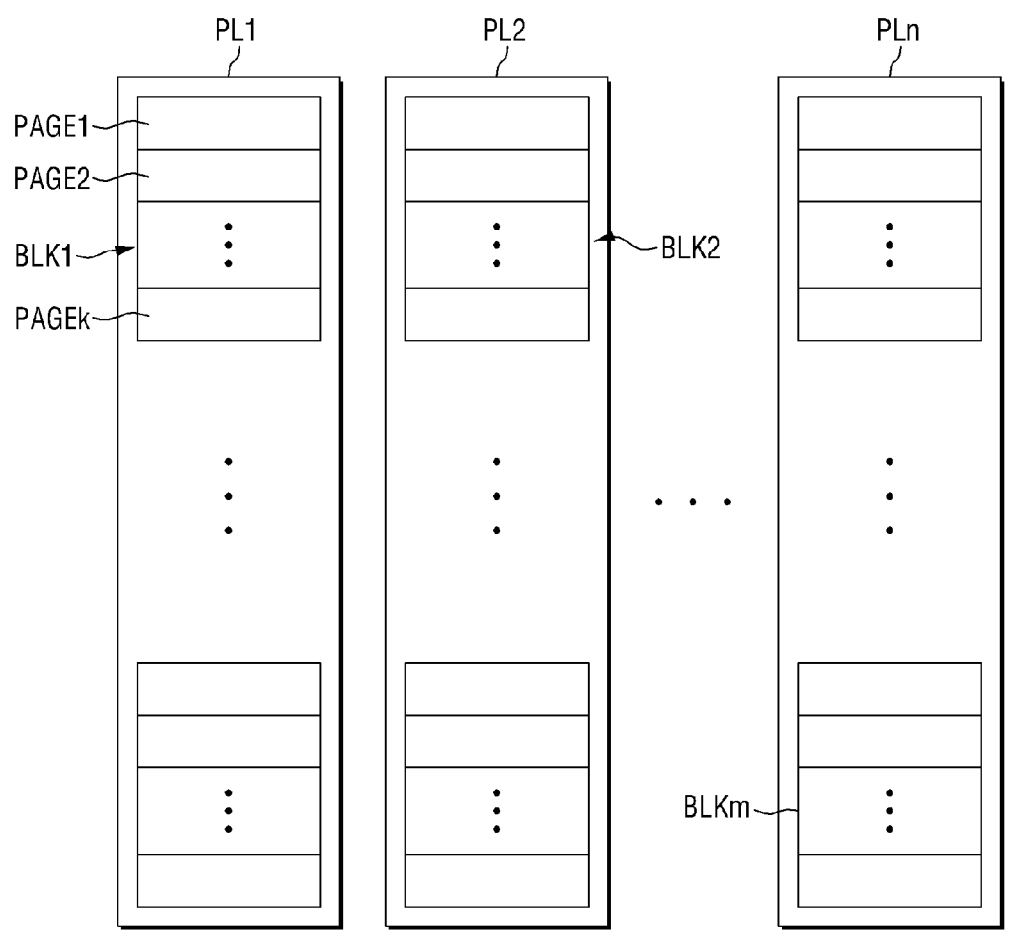
FIG. 2 is a block diagram for reference in describing the memory device of FIG. 1.
Figure 3:
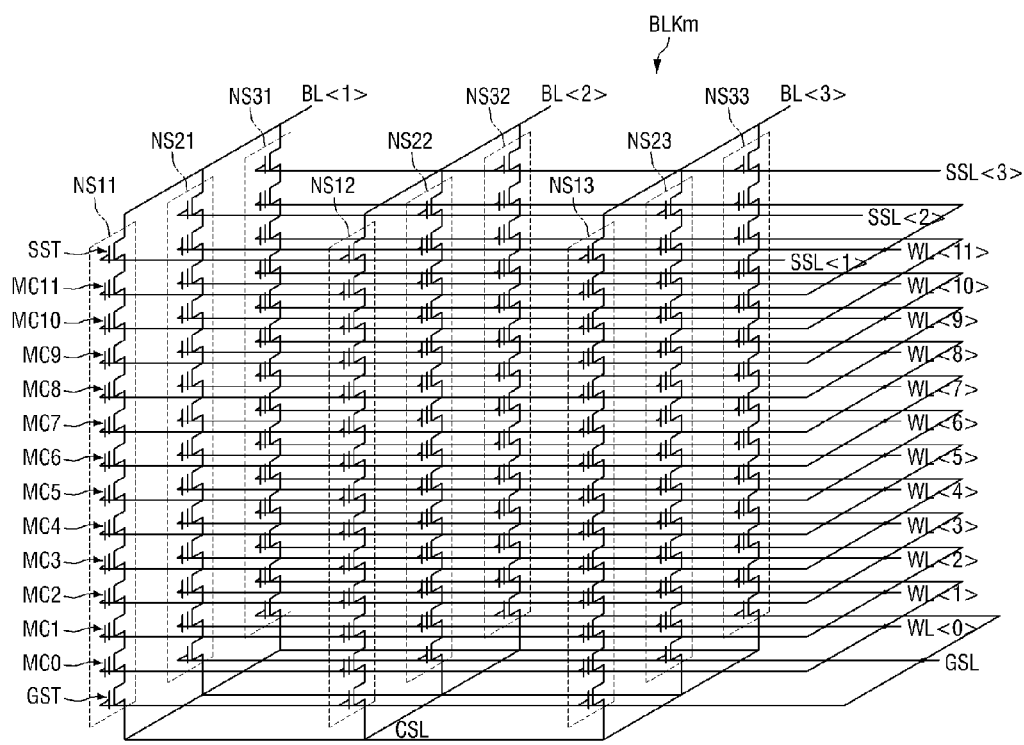
FIG. 3 is an equivalent circuit diagram for reference in describing a memory block of FIG. 2.
Figure 4:
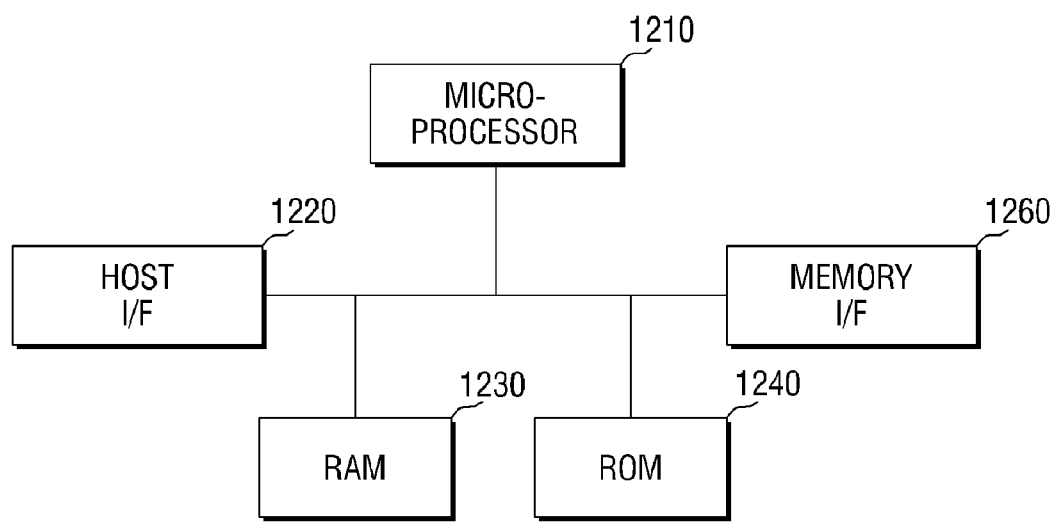
FIG. 4 is a block diagram for reference in describing a memory controller of FIG. 1.

FIG. 1 is a block diagram for reference in describing a nonvolatile memory device 1000 according to some embodiments of the present inventive concept, and FIG. 2 is a block diagram for reference in describing a memory device 1100 of FIG. 1. FIG. 3 is an equivalent circuit diagram for reference in describing a memory block of FIG. 2, and FIG. 4 is a block diagram for reference in describing a memory controller 1200 of FIG. 1.

Referring to FIG. 1, a nonvolatile memory device 1000 includes a memory device 1100 and a memory controller 1200.

The memory controller 1200 is connected to a host and the memory device 1100.

The memory controller 1200 is configured to access the memory device 1100 in response to a request from the host. For example, the memory controller 1200 is configured to control read, program, erase, and background operations of the memory device 1100. The memory controller 1200 is configured to provide an interface between the memory device 1100 and the host. The memory controller 1200 is configured to operate firmware for controlling the memory device 1100.

The memory device 1100 is under the control of the memory controller 1200, and may be a flash memory (e.g., CTF (Charge Trap Flash) device, a ROM (Read Only Memory), a PROM (Programmable ROM), an EPROM (Electrically Programmable ROM), an EEPROM (Electrically Erasable and Programmable ROM), or a resistive memory (e.g., a PRAM (Phase-change RAM), a FRAM (Ferroelectric RAM), or a RRAM (Resistive RAM)). Hereinafter, for convenience in explanation, it is exemplified that the memory 1100 is a CTF device.

The memory controller 1200 and the memory device 1100 may be integrated into one semiconductor device. Exemplarily, the memory controller 1200 and the memory device 1100 may be integrated into one semiconductor device to configure a memory card. For example, the memory controller 1200 and the memory device 1100 may be integrated into one semiconductor device to configure a memory card, such as a PC card (PCMCIA (Personal Computer Memory Card International Association)), a compact flash (CF) card, a smart media card (SM or SMC), a memory stick, a multimedia card (MMC, RS-MMC, or MMCmicro), a SD card (SD, miniSD, microSD, or SDHC), or a universal flash storage device (UFS).

Further, the memory controller 1200 and the memory device 1100 may be integrated into one semiconductor device to configure a SSD (Solid State Drive). In the case where the nonvolatile memory device 1000 is used as the SSD, the operating speed of the host that is connected to the memory nonvolatile memory device 1000 can be remarkably improved.

As another example, the nonvolatile memory device 1000 may be provided as one of various constituent elements of electronic devices, such as a computer, a UMPC (Ultra Mobile PC), a work station, a net-book, a PDA (Personal Digital Assistants), a portable computer, a web tablet, a wireless phone, a mobile phone, a smart phone, an e-book, a PMP (Portable Multimedia Player), a portable game machine, a navigation device, a black box, a digital camera, a 3-dimensional television receiver, a digital audio recorder, a digital audio player, a digital picture recorder, a digital picture player, a digital video recorder, a digital to video player, a device that can transmit and receive information in a wireless environment, one of various electronic devices constituting a home network, one of various electronic devices constituting a computer network, one of various electronic devices constituting a telematics network, an RFID device, or one of various constituent elements constituting a computing system.

Exemplarily, the memory device 1100 or the nonvolatile memory device 1000 may be mounted as various types of packages. For example, the memory device 1100 or the nonvolatile memory device 1000 may be packaged and mounted as PoP (Package on Package), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi Chip Package (MCP), Wafer-level Fabricated Package (WFP), Wafer-Level Processed Stack Package (WSP), or the like.

Here, referring to FIG. 2, the memory device 1100 may have, for example, a hierarchical structure. Specifically, the memory device 1100 may include a plurality of planes PL1 to PLn (where, n is a natural number). Each of the planes PL1 to PLn may include a plurality of blocks BLK1 to BLKm (where, m is a natural number).

Each of the blocks BLK1 to BLKm may include a plurality of pages PAGE1 to PAGEk (where, k is a natural number). A plurality of nonvolatile memory cells that correspond to the respective pages PAGE1 to PAGEk may be connected to a common word line. That is, if a signal is applied to the corresponding word line, the signal may be applied to the plurality of nonvolatile memory cells that belong to the corresponding pages PAGE1 to PAGEk.

Referring to FIG. 3, the respective blocks BLK1 to BLKm will be described in detail.

Referring to FIG. 3, cell strings NS11 to NS33 are arranged between bit lines BL<1>, BL<2>, and BL<3> and a common source line CSL.

The cell strings NS11, NS21, and NS31 are arranged between the first bit line BL<1> and the common source line CSL. The cell strings NS12, NS22, and NS 32 are arranged between the second bit line BL<2> and the common source line CSL. The cell strings NS13, NS23, and NS33 are arranged between the third bit line BL<3> and the common source line CSL.

String selection transistors SST of the cell strings NSs are connected to the corresponding bit lines BL. Ground selection transistors GST of the cell strings NSs are connected to the common source line CSL. Memory cells MC0 to MC11 are arranged between the string selection transistors SST and the ground selection transistors GST of the cell strings NSs.

Hereinafter, the cell strings NS are divided in the unit of rows and columns.

The cell strings NS commonly connected to one bit line form one column. For example, the cell strings NS11 to NS31 connected to the first bit line BL<1> may correspond to a first column. The cell strings NS12 to NS32 connected to the second bit line BL<2> may correspond to a second column. The cell strings NS13 to NS33 connected to the third bit line BL<3> may correspond to a third column.

The cell strings NS connected to one string selection line SSL form one row. For example, the cell strings NS11 to NS13 connected to the first string selection line SSL<1> form a first row. The cell strings NS21 to NS23 connected to the second string selection line SSL<2> form a second row. The cell strings NS31 to NS33 connected to the third string selection line SSL<3> form a third row.

The cell strings NSs in the same rows share the string selection line SSL. Each of the cell strings NSs includes the string selection transistor SST. The string selection transistors ST in the same rows may be controlled by one of the string selection lines SSL<1>, SSL<2>, and SSL<3>.

The memory cells MC in the same rows share a word line WL. At the same height, the memory cells MC in different rows share the word line WL.

The cell strings NSs in the same rows share the ground selection line GSL. Further, the cell strings NSs in different rows share the ground selection line GSL. Each of the cell strings NSs includes the ground selection transistor GST. The ground selection transistors GST may be controlled by one ground selection line GSL.

The common source line CSL is commonly connected to the cell strings NSs.

FIG. 3 illustrates an example of a vertical NAND flash memory device, but the present inventive concept is not limited thereto. The memory device 1100 according to the present inventive concept may be applied to a planar NAND flash memory device substantially in the same manner.

Referring to FIG. 4, the memory controller 1200 may include a microprocessor 1210, a host interface 1220, a RAM 1230, a ROM 1240, and a memory interface 1260.

The host interface 1220 includes a protocol to perform data exchange between the host and the memory controller 1200. Exemplarily, the memory controller 1200 is configured to communicate with an outside (host) through at least one of various interface protocols, such as a USB (Universal Serial Bus) protocol, a MMC (Multimedia Card) protocol, a PCI (Peripheral Component Interconnection) protocol, a PCI-E (PCT-Express) protocol, an ATA (Advanced Technology Attachment) protocol, a Serial-ATA protocol, a Parallel-ATA protocol, a SCSI (Small Computer Small Interface) protocol, an ESDI (Enhanced Small Disk Interface) protocol, and an IDE (Integrated Drive Electronics) protocol.

The RAM 1230 is a memory that serves as a buffer. For example, the RAM 1230 may store commands, addresses, and various kinds of variables that are input through the host interface 1220, and may store data and various kinds of variables that are output from the memory device 1100.

The ROM 1240 may store an operation firmware code of the memory system 1000, but the scope of the present inventive concept is not limited thereto. The firmware code may be stored in the nonvolatile memory device 1100 except for the ROM 12130, for example, a NAND flash memory device.

The microprocessor 1240 may store driving firmware codes. The firmware codes may be stored in various nonvolatile memory devices, for example, a NAND flash memory device, in addition to the ROM 1240.

The memory interface 1260 performs interfacing with the memory device 1100. For example, the memory interface 1260 includes a NAND interface or a NOR interface. A command of the microprocessor 1210 may be provided to the memory device 1100 through the memory interface 1260, and may also be provided to the nonvolatile memory device. Further, data that is output from the memory device 1100 is provided to the memory controller 1200 through the memory interface 1260.

Figure 5:
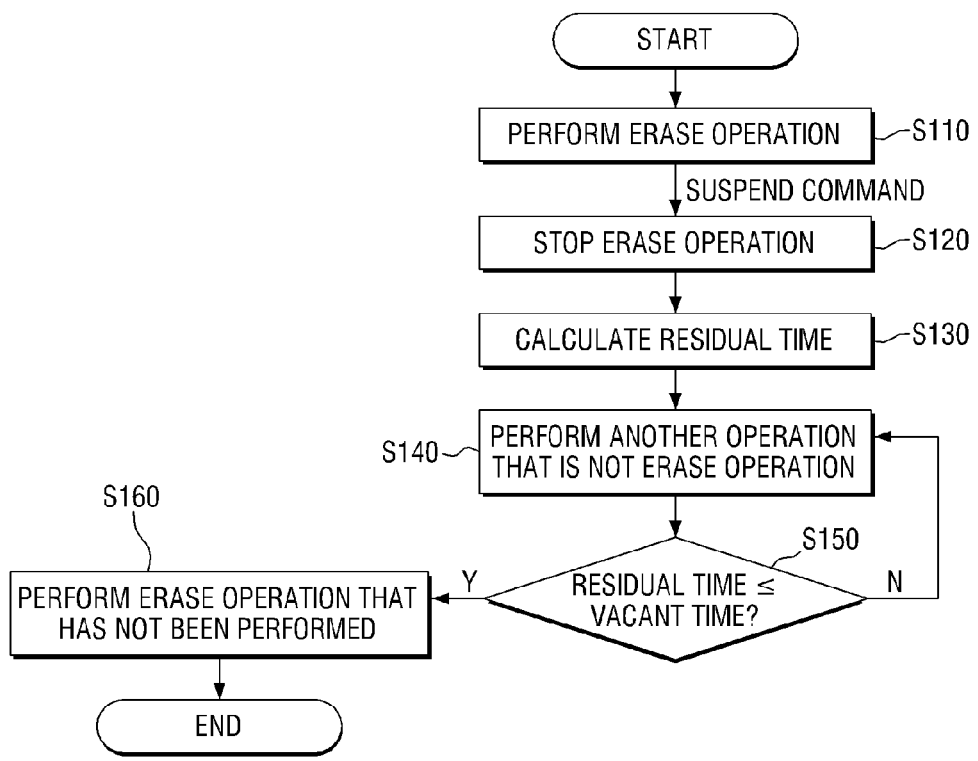
FIG. 5 is a flowchart for reference in describing a method for driving a nonvolatile memory device according to an embodiment of the present inventive concept.
Figure 6:
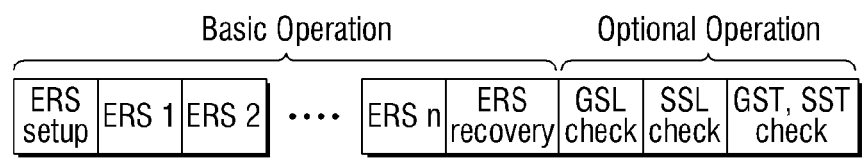
FIG. 6 is a diagram for reference in describing an erase operation.
Figure 7:
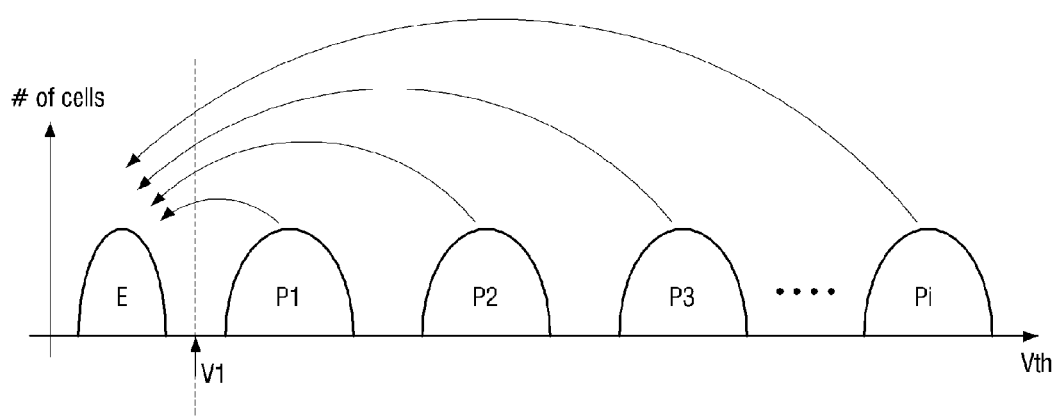
FIG. 7 is a diagram illustrating dispersion that is changed according to the erase operation.
Figure 8:
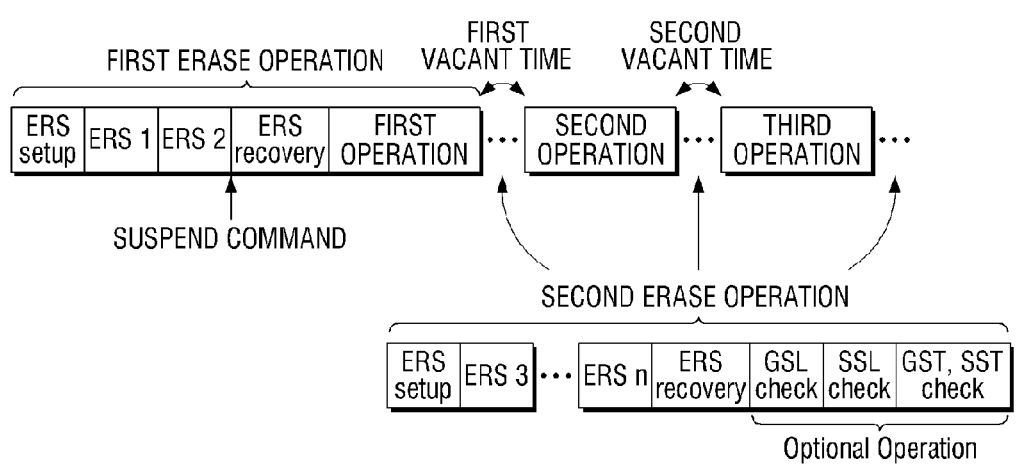
FIG. 8 is a flowchart for reference in describing the driving method of FIG. 5.

FIG. 5 is a flowchart for reference in describing a method for driving a nonvolatile memory device according to an embodiment of the present inventive concept. FIG. 6 is a diagram for reference in describing an erase operation, and FIG. 7 is a diagram illustrating dispersion that is changed according to the erase operation. In FIG. 7, x-axis represents a threshold voltage, and y-axis represents the number of memory cells. FIG. 8 is a flowchart for reference in describing the driving method of FIG. 5.

Referring to FIG. 5, an erase operation is first performed (S110). The memory controller 1200 may request the erase operation from the memory device 1100, and the memory device 1100 may perform the erase operation with respect to a plurality of memory cells. For example, the erase operation may be performed in the unit of a block, and may be performed with respect to at least one of the plurality of blocks BLK1 to BLKm. However, the present inventive concept is not limited thereto. For example, the erase operation may be performed in the unit of a page with respect to at least one of the plurality of pages PAGE1 to PAGEk.

Referring to FIG. 6, the erase operation includes a basic operation and an optional operation.

The basic operation includes an erase setup operation ERS setup for performing the erase operation, a plurality of unit erase operations ERS1 to ERSn (where, n is a natural number) that are performed after the erase setup operation, and an erase recovery operation ERS recovery that is performed after the plurality of unit erase operations ERS1 to ERSn.

Through the erase setup operation ERS setup, the memory device 1100 can be aware of a start of the erase operation to prepare the erase operation.

Through the plurality of unit erase operations ERS1 to ERSn, the threshold voltages of the plurality of memory cells can move to the lowest threshold voltage dispersion E. As shown in FIG. 7, the plurality of memory cells may have a plurality of threshold voltage dispersions E and P1 to Pi (where i is a natural number), and the threshold voltage dispersions of the plurality of memory cells may move to the lowest threshold voltage dispersion through the unit erase operations ERS. Since the plurality of memory cells may not entirely move to the lowest threshold voltage dispersion E through once performing the unit erase operation ERS, the threshold voltage dispersions of the plurality of memory cells move to the lowest threshold voltage dispersion E by performing the plurality of unit erase operations ERS1 to ERSn.

On the other hand, it can be measured by applying a first voltage V1 whether the plurality of memory cells have the lowest threshold voltage dispersion E. The first voltage V1 may be a verification voltage which is a voltage between the lowest threshold voltage dispersion E and the next threshold voltage dispersion P1. In other words, by applying the first voltage V1 to the plurality of memory cells, it can be checked how many memory cells have the lowest voltage dispersion E or how many memory cells do not have the lowest voltage dispersion E and require the erase operation.

FIG. 7 illustrates that the plurality of memory cells are MLCs (Multi Level Cells) that have the plurality of threshold voltage dispersions E and P1 to Pi, but the present inventive concept is not limited thereto. The plurality of memory cells may be SLCs (Single Level Cells) that have two threshold voltage dispersions E and P1.

The ERS recovery operation that is performed after completion of the unit erase operations ERS1 to ERSn is an operation to prepare the memory device 1100 so that the memory device 1100 can perform another operation that is not the erase operation, for example, the write, read, or background operation.

The optional operation is an operation to check lines and transistors connected to the plurality of memory cells. For example, the optional operation may include an operation to check the ground selection line GSL (GSL check), an operation to check the string selection line SSL (SSL check), and an operation to check the ground selection transistor GST and the string selection transistor SST (GST and SST check). However, the present inventive concept is not limited thereto, and the optional operation may include other operations except for the above-described operations.

Referring to FIG. 8, the memory device 1100 performs the erase operation through the memory controller 1200. The memory device 1100 performs the erase setup operation ERS setup and the unit erase operations ERS with respect to the plurality of memory cells.

Referring again to FIG. 5, the memory controller 1200 stops the erase operation by a suspend command. The memory controller 1200 provides the suspend command to the memory device 1100, and the memory device 1100 stops the erase operation. The erase operation requires a longer operation time than the operation time of the program, read, or background operation. Accordingly, if it is required to perform another operation while performing the erase operation in order to shorten the driving time of the nonvolatile memory device 1000, the memory device 1100 stops the erase operation being performed to perform another operation, and if the performing of another operation is completed, the memory device 1100 performs the remaining erase operation that has not yet been performed.

Referring to FIG. 8, if the suspend command is received during performing of the erase operation, the memory device 1100 performs the erase recovery operation ERS recovery and stops the erase operation. Accordingly, by the suspend command, the erase operation may be divided into a first erase operation that has already been performed, and a second erase operation that has not yet been performed.

FIG. 8 exemplarily illustrates that the suspend command is received while the first unit erase operation ERS1 and the second unit erase operation ERS2 are performed with respect to the plurality of memory cells.

Referring again to FIG. 5, the memory controller 1200 calculates the residual time of the second erase operation (S130). The residual time may be calculated using erase operation information. The erase operation information includes, for example, at least one of the proceeding degree of the erase operation, the number of memory cells of which the erase operation has been performed, and the number of memory cells having the first voltage or more among the plurality of memory cells.

For example, referring to FIG. 8, the erase operation is performed in a manner that the first erase operation has been performed, but the second erase operation has not yet been performed. Accordingly, the erase operation information may include the erase setup operation ERS setup included in the second erase operation, the remaining unit erase operations ERS3 to ERSn, and information on the optional operation. Further, through applying of the first voltage V1 (in FIG. 7) to the plurality of memory cells, the erase operation information may further include the number of memory cells having the threshold voltage that is equal to or higher than the first voltage V1, and the number of memory cells of which the erase operation has been performed among the plurality of memory cells.

The memory controller 1200 may calculate the residual time using the erase operation information, and may store the residual time in the RAM 1230.

Referring again to FIG. 5, another operation that is not the erase operation is performed (S140).

In FIG. 8, other operations are illustrated as first to third operations. The memory device 1100 performs the first erase operation, stops the erase operation by the suspend operation, and then performs the first operation. Other operations, that is, the first to third operations, are performed with respect to other memory cells that are not the plurality of memory cells of which the erase operation is performed. For example, in the case where the erase operation is performed in the unit of a block and the erase operation is performed with respect to the first block BLK1 (in FIG. 2), another operation is performed with respect to the second to m-th blocks BLK2 to BLKm. Another operation is not performed with respect to the blocks of which the erase operation has not been completed.

Further, for example, in the case where the erase operation is performed in the unit of a page and the erase operation is performed with respect to the first page PAGE1 (in FIG. 2), another operation is performed with respect to the second to k-th pages PAGE2 to PAGEk. Another operation is not performed with respect to the pages of which the erase operation has not been completed.

Referring again to FIG. 5, after another operation is performed, the residual time and a vacant time are compared with each other (S150). If the residual time is equal to or shorter than the vacant time, the erase operation that has not yet been performed, that is, the second erase operation, is performed (S160), while if the residual time is longer than the vacant time, a still another operation is performed.

For example, referring to FIG. 8, after the first operation is performed, a first vacant time between the first operation and the second operation and the residual time are compared with each other. Here, the vacant time means a term between the first operation and the second operation, and specifically, means a time between the first operation completion time point and the second operation start time point. The memory controller 1200 obtains the vacant time, and compares the first vacant time with the pre-obtained residual time. In this case, if the first vacant time is longer than the residual time, the second erase operation is performed after the first operation, and then the second operation is performed. In other words, the second erase operation is performed between the first operation and the second operation.

On the other hand, if the second operation is not performed after the first operation, the second erase operation may be performed after the first operation without the necessity of obtaining the first vacant time.

If the residual time is longer than the first vacant time, the second erase operation is not performed, but the second operation is performed. After the second operation is performed, a second vacant time between the second operation and the third operation, that is, the time between the second operation completion time point and the third operation start time point, is obtained, and the second vacant time and the residual time are compared with each other. If the residual time is equal to or shorter than the second vacant time, the second erase operation may be performed after the second operation. If the residual time is longer than the second vacant time, the third operation is performed after the second operation, and the second erase operation may be performed after the third operation. If plural other operations exist even after the third operation, the time to perform the second erase operation may be determined in the same method as described above.

If the residual time and the vacant time are not compared with each other, the second erase operation is performed just after the first operation. However, if the residual time of the second erase operation is longer than the first vacant time between the first operation and the second operation, the second erase operation is stopped again, and the remaining second erase operation that has not yet been performed is performed after the second operation is performed. Since the second erase operation is not performed at a time, but is dividedly performed several times, the performance of the nonvolatile memory device 1000 may be deteriorated.

Further, in order to perform the erase operation, the erase setup operation ERS setup and the erase recovery operation ERS recovery are required before and after the unit erase operation ERS. However, if the second erase operation is not preformed at a time, but is dividedly performed several times, the erase setup operation ERS setup and the erase recovery operation ERS recovery are also performed several times to require the processing time to that extent. Accordingly, the driving speed of the nonvolatile memory device 1000 may be reduced.

Accordingly, if the second erase operation is performed at a time without being stopped through comparison of the residual time with the vacant time, the performance and the driving speed of the nonvolatile memory device 1000 can be improved.

A method for driving a nonvolatile memory device 1000 according to another embodiment of the present inventive concept will be described with reference to FIGS. 8 and 9. Explanation of the duplicate contents to those as described above will be omitted, and explanation will be made around the different points between this embodiment and the above-described embodiment.

Figure 9:
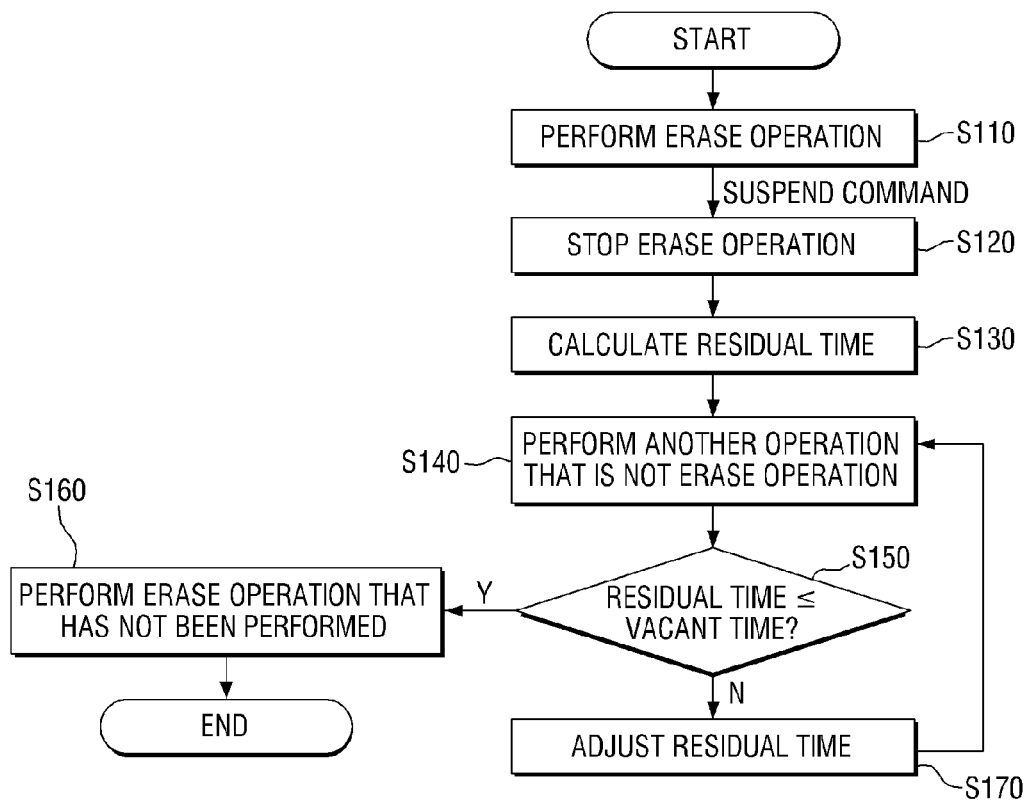
FIG. 9 is a flowchart for reference in describing a method for driving a nonvolatile memory device according to another embodiment of the present inventive concept.

FIG. 9 is a flowchart for reference in describing a method for driving a nonvolatile memory device according to another embodiment of the present inventive concept.

According to a driving method of FIG. 9, in the same manner as the driving method of FIG. 8, an erase operation is performed (S110), the erase operation is stopped by a suspend command (S120), the residual time of the second erase operation is calculated (S130), another operation that is not the erase operation (e.g., the first to third operations of FIG. 8) is performed (S140), the residual time and a vacant time are compared with each other (S150), and a second erase operation is performed if the residual time is equal to or shorter than the vacant time (S160).

If the residual time is longer than the vacant time, the memory controller 1200 may adjust the residual time (S170). For example, the residual time can be reduced by removing an optional operation included in the second erase operation. The optional operation is an operation that is performed in addition to the erase operation, and is an operation that is not related to movement of threshold voltage dispersion of the memory cell to the lowest voltage dispersion E. Accordingly, it is not required to perform the optional operation every time when the basic operation of the erase operation is performed, and the residual time can be shortened through removal of the optional operation.

In order to adjust the residual time, an operation included in the optional operation, for example, at least one of an operation to check the ground selection line GSL (GSL check), an operation to check the string selection line SSL (SSL check), and an operation to check the ground selection transistor GST and the string selection transistor SST (GST and SST check), may be removed.

On the other hand, in order to adjust the residual time, the number of the unit erase operations ERS3 to ERSn of the second operation can be adjusted. The memory controller 1200 uses erase operation information to calculate the residual time. The erase operation information includes information on the number of memory cells having the lowest voltage dispersion E that is obtained using the first voltage V1. However, if the number of memory cells having the lowest voltage dispersion E is larger than that as expected through performing of the first erase operation, it is not required to perform all the unit erase operations ERS3 to ERSn of the second operation. Accordingly, only the third to first unit erase operations ERS3 to ERS1 (where, "1" is a natural number that is smaller than n) can be performed during the second erase operation.

After the adjustment of the residual time, the second operation is performed. After performing the second operation, it is determined whether to perform the second erase operation, from which the optional operation is removed, or the third operation by comparing the second vacant time between the second operation and the third operation with the residual time that is adjusted through removal of the optional operation. Since the optional operation is removed, the residual time of the second erase operation is shortened to heighten the probability of performing the second erase operation.

Figure 10:
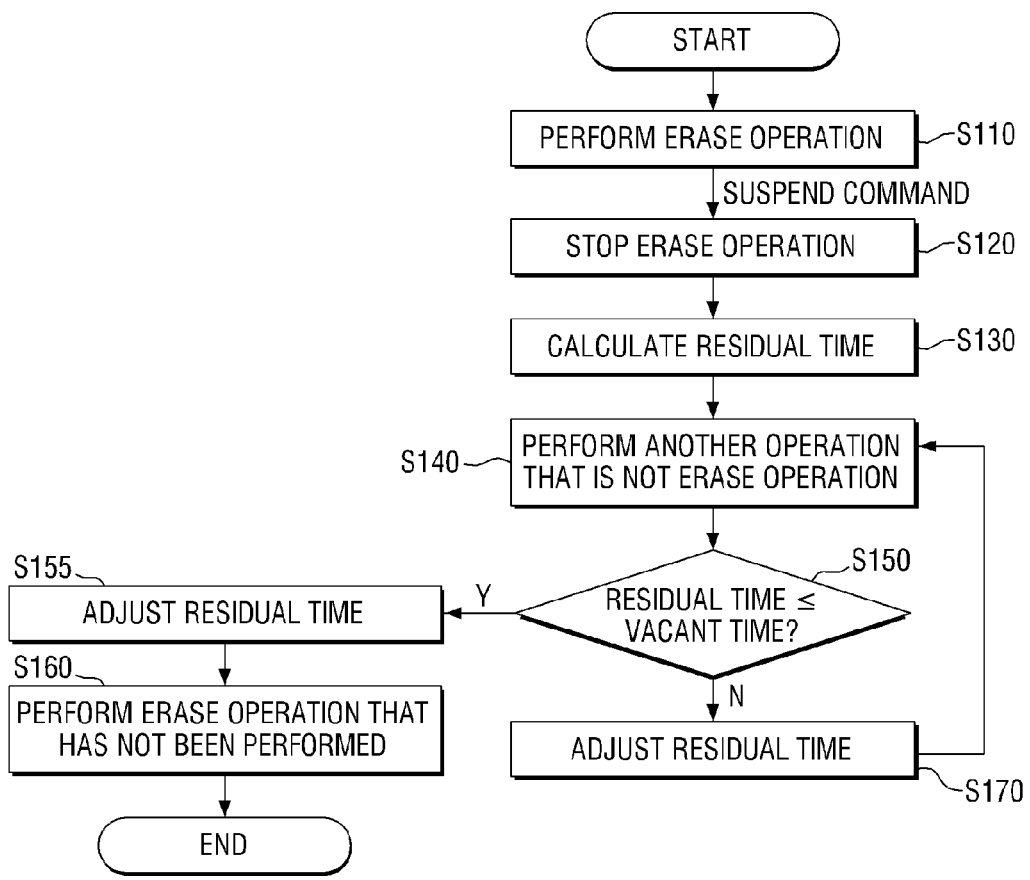
FIG. 10 is a flowchart for reference in describing a method for driving a nonvolatile memory device according to still another embodiment of the present inventive concept.

Referring to FIGS. 8 to 10, a method for driving a nonvolatile memory device 1000 according to still another embodiment of the present inventive concept will be described. Explanation of the duplicate contents to those as described above will be omitted, and explanation will be made around the different points between this embodiment and the above-described embodiment.

FIG. 10 is a flowchart for reference in describing a method for driving a nonvolatile memory device according to still another embodiment of the present inventive concept.

According to a driving method of FIG. 9, in the same manner as the driving method of FIG. 9, an erase operation is performed (S110), the erase operation is stopped by a suspend command (S120), the residual time of the second erase operation is calculated (S130), another operation that is not the erase operation (e.g., the first to third operations of FIG. 8) is performed (S140), the residual time and a vacant time are compared with each other (S150), a second erase operation is performed if the residual time is equal to or shorter than the vacant time (S160), and the memory controller 1200 adjusts the residual time if the residual time is longer than the vacant time (S170).

Before the second erase operation is performed, the residual time can be adjusted (S155). In order to adjust the residual time, the optional operation may be removed as described above. If the second erase operation is performed after the residual time is adjusted, a margin measured from the completion of the second erase operation to the start of the second operation can be secured, and thus the nonvolatile memory device 1000 can be stably driven.

On the other hand, in order to adjust the residual time, the number of the unit erase operations ERS3 to ERSn of the second operation can be adjusted. The memory controller 1200 uses erase operation information to calculate the residual time. The erase operation information includes information on the number of memory cells having the lowest voltage dispersion E that is obtained using the first voltage V1. However, if the number of memory cells having the lowest voltage dispersion E is larger than that as expected through performing of the first erase operation, it is not required to perform all the unit erase operations ERS3 to ERSn of the second operation. Accordingly, only the third to first unit erase operations ERS3 to ERS1 (where, "1" is a natural number that is smaller than n) can be performed during the second erase operation.

Figure 11:
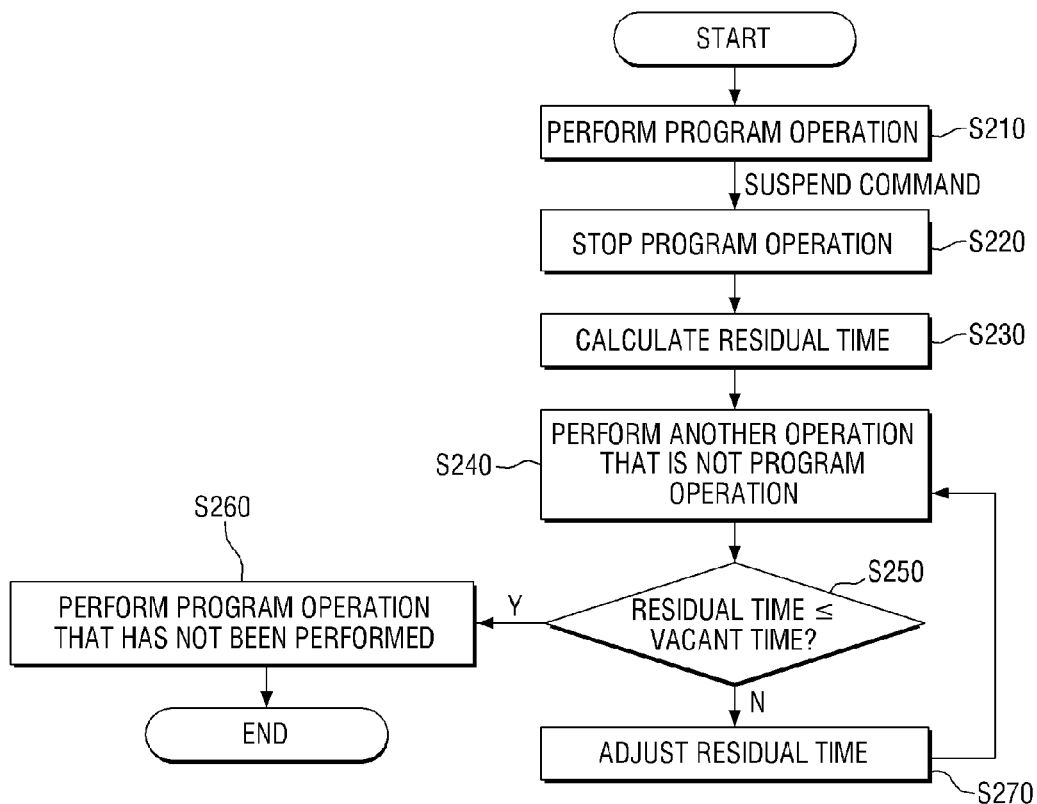
FIG. 11 is a flowchart for reference in describing a method for driving a nonvolatile memory device according to still another embodiment of the present inventive concept.
Figure 12:
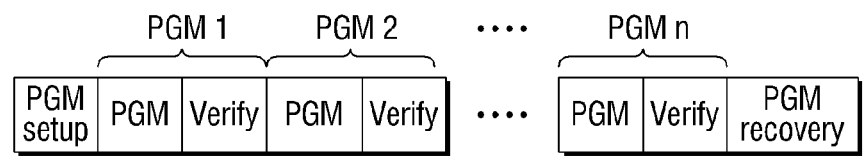
FIG. 12 is a diagram for reference in describing a program operation.
Figure 13:
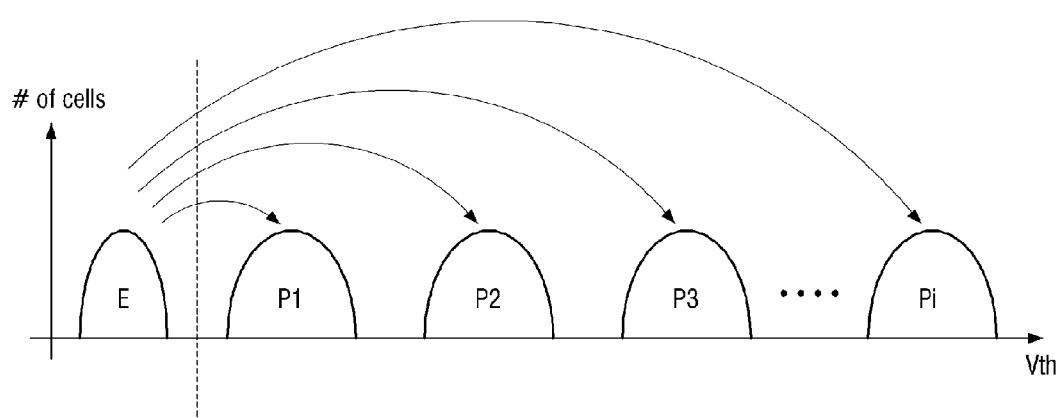
FIG. 13 is a diagram illustrating dispersion that is changed according to the program operation.
Figure 14:
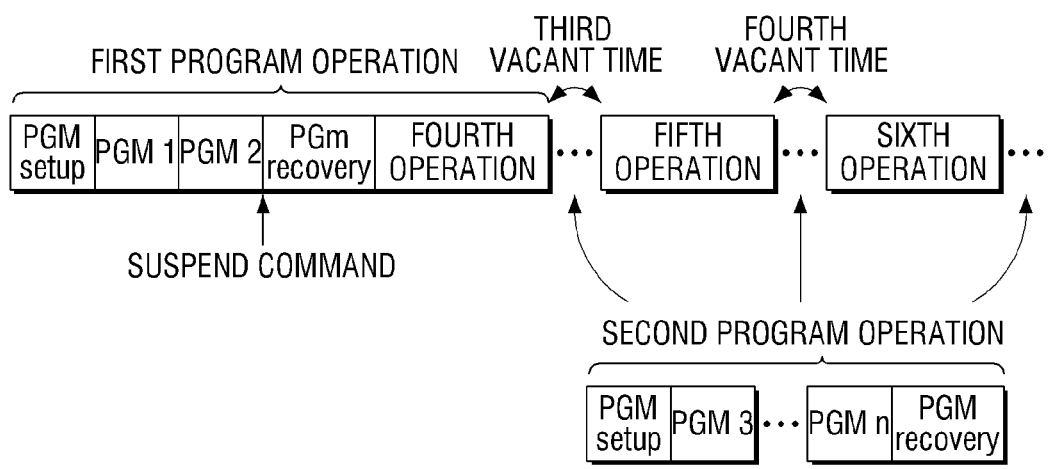
FIG. 14 is a flowchart for reference in describing the driving method of FIG. 11.

FIG. 11 is a flowchart for reference in describing a method for driving a nonvolatile memory device according to still another embodiment of the present inventive concept. FIG. 12 is a diagram for reference in describing a program operation, and FIG. 13 is a diagram illustrating dispersion that is changed according to the program operation. In FIG. 13, x-axis represents a threshold voltage, and y-axis represents the number of memory cells. FIG. 14 is a flowchart for reference in describing the driving method of FIG. 11.

Referring to FIG. 11, a program operation is first performed (S210). The memory controller 1200 may request the program operation from the memory device 1100, and the memory device 1100 may perform the program operation with respect to a plurality of memory cells.

Referring to FIG. 12, the program operation includes a program setup operation PGM setup, a plurality of unit program operations PGM1 to PGMn (where, n is a natural number) that are performed after the program setup operation PGM setup, and a program recovery operation PGM recovery that is performed after the plurality of unit program operations PGM1 to PGMn.

Through the program setup operation PGM setup, the memory device 1100 can be aware of a start of the program operation to prepare the program operation.

Through the plurality of unit program operations PGM1 to PGMn, the threshold voltages of the plurality of memory cells as shown in FIG. 13 can move from the lowest threshold voltage dispersion E to the plurality of threshold voltage dispersions P1 to Pi.

Each of the plurality of unit program operations PGM1 to PGMn may include a unit program operation PGM and a unit verification operation Verify. The threshold voltages of the plurality of memory cells may move through the unit program operations PGM, and it can be determined whether the threshold voltages of the plurality of memory cells have accurately moved and whether additional unit program operations PGM are required through the unit verification operation Verify.

FIG. 13 illustrates that the plurality of memory cells are MLCs (Multi Level Cells) that have the plurality of threshold voltage dispersions E and P1 to Pi, but the present inventive concept is not limited thereto. The plurality of memory cells may be SLCs (Single Level Cells) that have two threshold voltage dispersions E and P1.

The PGM recovery operation that is performed after completion of the unit program operations PGM1 to PGMn is an operation to prepare the memory device 1100 so that the memory device 1100 can perform another operation that is not the program operation, for example, the read, erase, or background operation.

Referring to FIG. 14, the memory device 1100 performs the program operation through the memory controller 1200. The memory device 1100 performs the program setup operation PGM setup and the unit program operations PGM1 to PGMn with respect to the plurality of memory cells.

Referring again to FIG. 11, the memory controller 1200 stops the program operation by a suspend command. The memory controller 1200 provides the suspend command to the memory device 1100, and the memory device 1100 stops the program operation. It may be required to perform other operations, for example, read, erase, and background operations, according to requirements of the memory device 1100 while performing the program operation. If it is required to perform another operation during the performing of the program operation in order to cope with the requirements of the memory device 1000, the memory device 1100 may stop the program operation being performed to perform another operation, and if the performing of another operation is completed, the memory device 1100 performs the remaining program operation that has not yet been performed.

Referring to FIG. 11, if the suspend command is received during performing of the program operation, the memory device 1100 performs the program recovery operation PGM recovery and stops the program operation. Accordingly, by the suspend command, the program operation may be divided into a first program operation that has already been performed, and a second program operation that has not yet been performed.

FIG. 13 exemplarily illustrates that the suspend command is received while the first unit program operation PGM1 and the second unit program operation PGM2 are performed with respect to the plurality of memory cells.

Referring again to FIG. 11, the memory controller 1200 calculates the residual time of the second program operation (S230). The residual time may be calculated using program operation information. The program operation information includes, for example, at least one of the proceeding degree of the program operation, the number of memory cells of which the program operation has been performed, and the number of memory cells having the first voltage or more among the plurality of memory cells.

For example, referring to FIG. 14, the program operation is performed in a manner that the first program operation has been performed, but the second program operation has not yet been performed. Accordingly, the program operation information may include the program setup operation PGM setup included in the second program operation, and information on the remaining unit program operations PGM3 to PGMn. Further, the program operation information may include information on the number of programmed memory cells among the plurality of memory cells.

The memory controller 1200 may calculate the residual time using the program operation information, and may store the residual time in the RAM 1230.

Referring again to FIG. 11, another operation that is not the program operation is performed (S240).

In FIG. 11, other operations are illustrated as fourth to sixth operations. The memory device 1100 performs the first program operation, stops the program operation by the suspend operation, and then performs the fourth operation. Other operations, that is, the fourth to sixth operations, are performed with respect to other memory cells that are not the plurality of memory cells of which the program operation is performed. For example, in the case where the program operation is performed in the unit of a block and the program operation is performed with respect to the first block BLK1 (in FIG. 2), another operation is performed with respect to the second to m-th blocks BLK2 to BLKm. Another operation is not performed with respect to the blocks of which the program operation has not been completed.

Further, for example, in the case where the program operation is performed in the unit of a page and the program operation is performed with respect to the first page PAGE1 (in FIG. 2), another operation is performed with respect to the second to k-th pages PAGE2 to PAGEk. Another operation is not performed with respect to the pages of which the program operation has not been completed.

Referring again to FIG. 11, after another operation is performed, the residual time and a vacant time are compared with each other (S250). If the residual time is equal to or shorter than the vacant time, the program operation that has not yet been performed, that is, the second program operation, is performed (S260), while if the residual time is longer than the vacant time, a still another operation is performed.

For example, referring to FIG. 14, after the fourth operation is performed, a third vacant time between the fifth operation and the sixth operation and the residual time are compared with each other. Here, the vacant time means a term between the fourth operation and the sixth operation, and specifically, means a time between the fourth operation completion time point and the sixth operation start time point. The memory controller 1200 obtains the vacant time, and compares the third vacant time with the pre-obtained residual time. In this case, if the third vacant time is longer than the residual time, the second program operation is performed after the fourth operation, and then the fifth operation is performed. In other words, the second program operation is performed between the fourth operation and the fifth operation.

On the other hand, if the fifth operation is not performed after the fourth operation, the second program operation may be performed after the fourth operation without the necessity of obtaining the third vacant time.

If the residual time is longer than the third vacant time, the second program operation is not performed, but the fifth operation is performed. After the fifth operation is performed, a fourth vacant time between the fifth operation and the sixth operation, that is, the time between the fifth operation completion time point and the sixth operation start time point, is obtained, and the fourth vacant time and the residual time are compared with each other. If the residual time is equal to or shorter than the fourth vacant time, the second program operation may be performed after the fifth operation. If the residual time is longer than the fourth vacant time, the sixth operation is performed after the fifth operation, and the second program operation may be performed after the sixth operation. If plural other operations exist even after the sixth operation, the time to perform the second program operation may be determined in the same method as described above.

If the residual time and the vacant time are not compared with each other, the second program operation is performed just after the fourth operation. However, if the residual time of the second program operation is longer than the third vacant time between the fourth operation and the fifth operation, the second program operation is stopped again, and the remaining second program operation that has not yet been performed is performed after the second program is performed. Since the second program operation is not performed at a time, but is dividedly performed several times, the performance of the nonvolatile memory device 1000 may be deteriorated.

Further, in order to perform the program operation, the program setup operation PGM setup and the program recovery operation PGM recovery are required to be performed before and after the unit program operations PGM1 to PGMn. However, if the second program operation is not preformed at a time, but is dividedly performed several times, the program setup operation PGM setup and the program recovery operation PGM recovery are also performed several times to require the processing time to that extent. Accordingly, the driving speed of the nonvolatile memory device 1000 may be reduced.

Accordingly, if the second program operation is performed at a time without being stopped through comparison of the residual time with the vacant time, the performance and the driving speed of the nonvolatile memory device 1000 can be improved.

FIGS. 15 to 19 are diagrams for reference in describing a memory system that uses a method for driving a nonvolatile memory device according to some embodiments of the present inventive concept.

Figure 15:
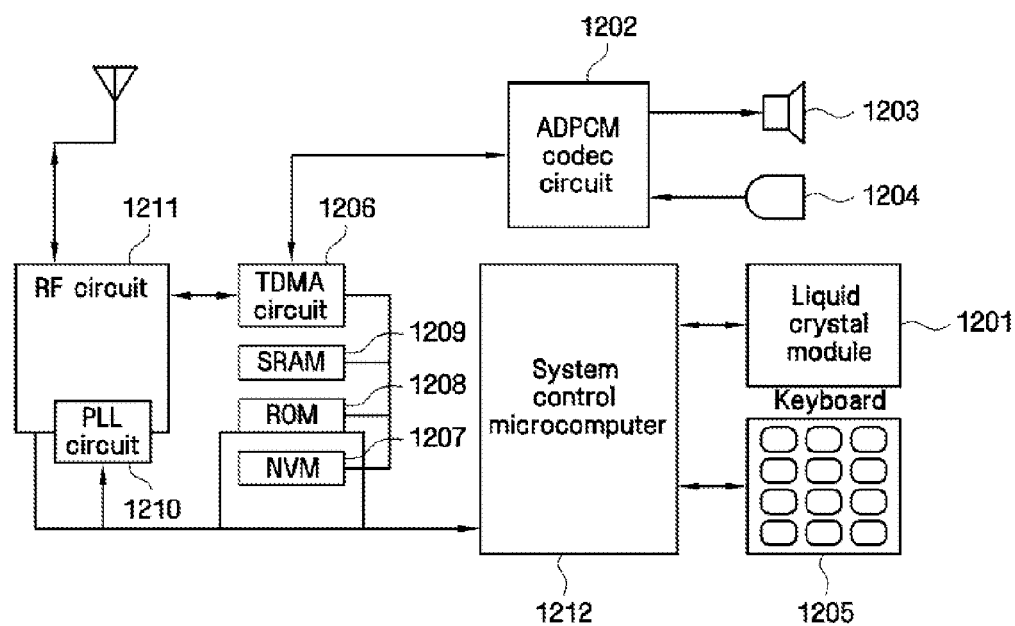
FIGS. 15, 16, 17, 18 and 19 are diagrams for reference in describing a memory system that uses a method for driving a nonvolatile memory device according to some embodiments of the present inventive concept.

FIG. 15 is an exemplary diagram of a cellular phone system using a method for driving a nonvolatile memory device according to some embodiments of the present inventive concept.

Referring to FIG. 15, the cellular phone system includes a compression or decompression ADPCM codec circuit 1202, a speaker 1203, a microphone 1204, a TDMA circuit 1206 for time-division-multiplexing digital data, a PLL circuit 1210 setting a carrier frequency of a wireless signal, and an RF circuit 1211 for transferring or receiving the wireless signal.

Further, the cellular phone system may include various kinds of memory devices, and for example, may include a nonvolatile memory device 1207, a ROM 1208, and an SRAM 1209. The nonvolatile memory device 1207 may be the nonvolatile memory device according to the embodiments of the present inventive concept, and may store, for example, ID numbers. The ROM 1208 may store programs, and the SRAM 1209 may serve as a workspace for a system control microcomputer 1212 or may temporarily store data. Here, the system control microcomputer 1212 may be a processor which can control the erase operation of the nonvolatile memory device 1207 like the memory controller 1200 of FIG. 1.

Figure 16:
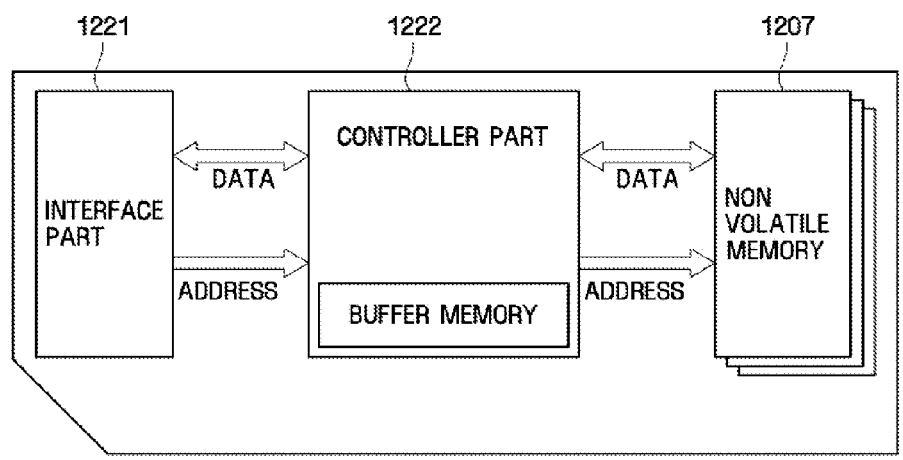

FIG. 16 is an exemplary diagram of a memory card using a method for driving a nonvolatile memory device according to some embodiments of the present inventive concept. The memory card may be, for example, an MMC card, an SD card, a multiuse card, a micro SD card, a memory stick, a compact SD card, an ID card, a PCMCIA card, a SSD card, a chip card, a smart card, or a USB card.

Referring to FIG. 16, the memory card may include at least one of an interface part 1221 performing an interface with an outside, a controller 1222 having a buffer memory and controlling the operation of the memory card, and a nonvolatile memory device 1207 using the method for driving the nonvolatile memory device according to some embodiments of the present inventive concept. The controller 1222 is a processor which can control the erase and program operations of the nonvolatile memory device 1207 like the memory controller 1200 of FIG. 1. Specifically, the controller 1222 is coupled to the nonvolatile memory device 1207 and the interface part 1221 through a data bus DATA and an address bus ADDRESS.

Figure 17:
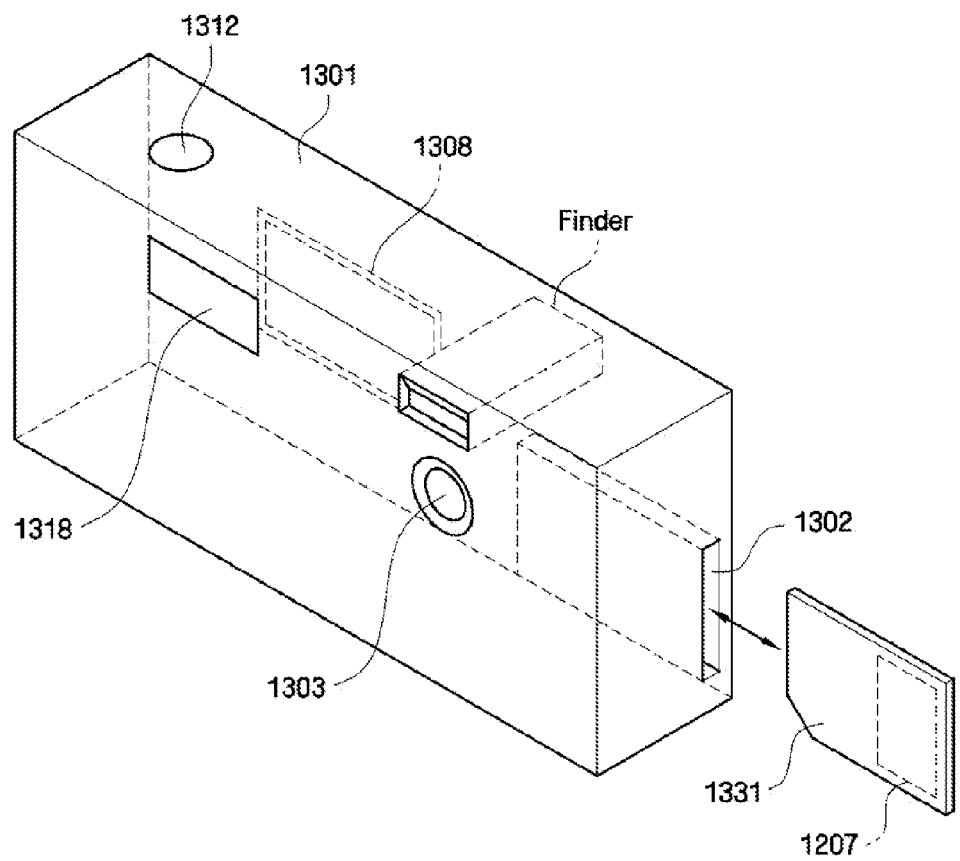

FIG. 17 is an exemplary view of a digital still camera using a method for driving a nonvolatile memory device according to some embodiments of the present inventive concept.

Referring to FIG. 17, the digital still camera includes a body 1301, a slot 1302, a lens 303, a display unit 1308, a shutter button 1312, and a strobe 1318. In particular, a memory card 1331 may be inserted into the slot 1308, and the memory card 1331 may include at least one nonvolatile memory device 1207 using the method for driving the nonvolatile memory device according to some embodiments of the present inventive concept.

If the memory card 1331 is of a contact type, the memory card 1331 comes in electrical contact with a specific electrical circuit on a circuit board when the memory card 1331 is inserted into the slot 1308. If the memory card 1331 is of a non-contact type, the memory card 1331 performs communications through a wireless signal.

Figure 18:
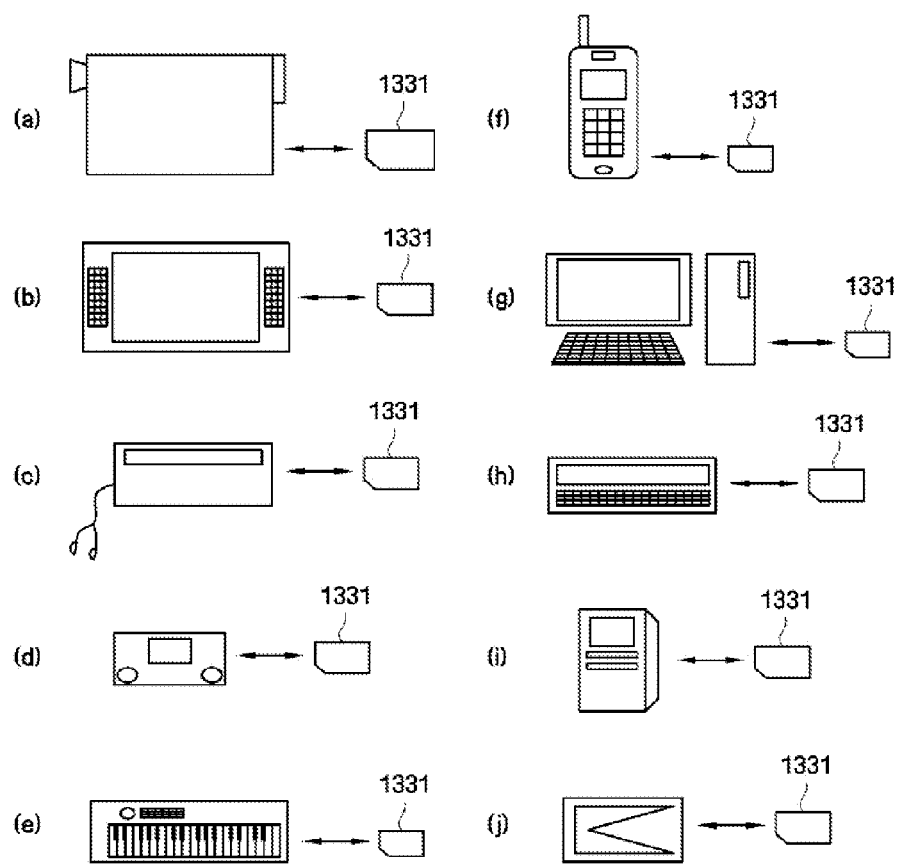

FIG. 18 is an exemplary view for reference in describing various systems using the memory card 1331 of FIG. 16.

Referring to FIG. 18, the memory card 1331 may be used in (a) a video camera, (b) a television receiver, (c) an audio device, (d) a game machine, (e) an electronic music device, (f) a cellular phone, (g) a computer, (h) a PDA (Personal Digital Assistant), (i) a voice recorder, or (j) a PC card.

Figure 19:
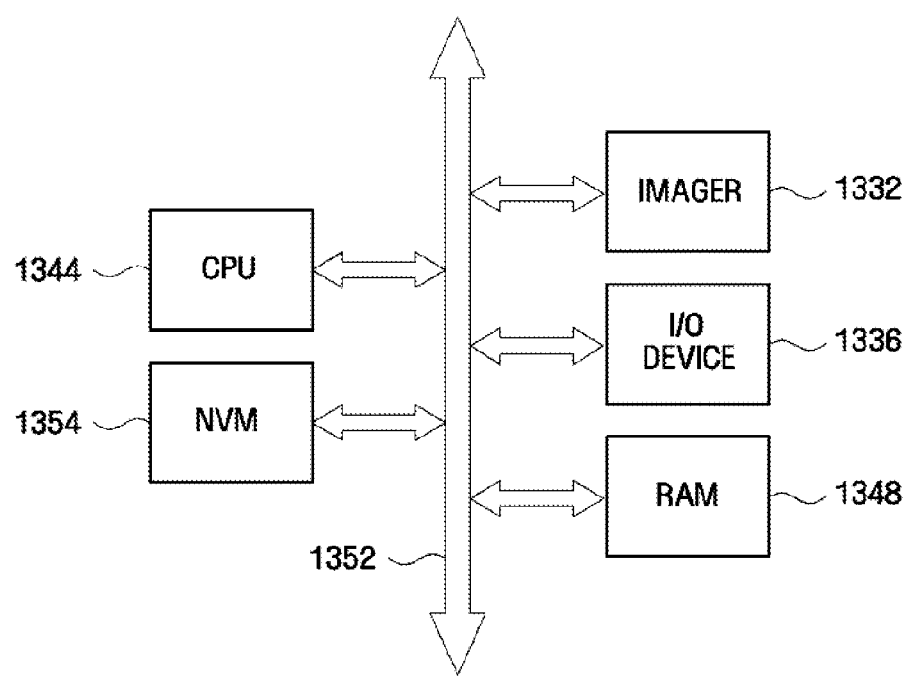

FIG. 19 is an exemplary diagram of an image sensor system using a method for driving a nonvolatile memory device according to some embodiments of the present inventive concept.

Referring to FIG. 19, an image sensor system may include an image sensor 1332, an input/output device 1336, a RAM 1348, a CPU 1344, and a nonvolatile memory device 1354 using the method for driving the nonvolatile memory device according to some embodiments of the present inventive concept. The respective constituent elements, that is, the image sensor 1332, the input/output device 1336, the RAM 1348, the CPU 1344, and the nonvolatile memory device 1354, communicate with each other through a bus 1352. The image sensor 1332 may include a photo sensing element, such as a photo gate and a photodiode. The respective constituent elements may be constructed into one chip together with a processor, or may be configured as a separate chip from the processor.

Although preferred embodiments of the present inventive concept have been described for illustrative purposes, those skilled in the art will appreciate that various modifications, additions and substitutions are possible, without departing from the scope and spirit of the inventive concept as disclosed in the accompanying claims.

What is claimed is:

1. A method for driving a nonvolatile memory device, comprising:
    performing an erase operation with respect to a plurality of memory cells;
    stopping the erase operation by a suspend command;
    calculating a residual time of an unperformed erase operation of the erase operation;
    performing a first operation;
    comparing a first vacant time between a completion time point of the first operation and a start time point of a second operation with the residual time; and
    performing the unperformed erase operation if the residual time is equal to or shorter than the first vacant time, and performing the second operation if the residual time is longer than the first vacant time,
    wherein the calculating the residual time comprises calculating the residual time using erase operation information, and
    the erase operation information includes at least one of a proceeding degree of the erase operation, a number of memory cells of which the erase operation has been performed, and a number of memory cells having voltages that are equal to or higher than a first voltage among the plurality of memory cells.

2. The method for driving a nonvolatile memory device of claim 1, wherein the first voltage is a verification voltage.

3. The method for driving a nonvolatile memory device of claim 1, wherein the performing the unperformed erase operation comprises performing the unperformed erase operation by adjusting the residual time of the unperformed erase operation.

4. The method for driving a nonvolatile memory device of claim 3, wherein the unperformed erase operation includes at least one unit erase operation and an optional operation, and
    the adjusting the residual time comprises removing the optional operation.

5. The method for driving a nonvolatile memory device of claim 4, wherein the optional operation includes an operation of checking lines connected to the plurality of memory cells.

6. The method for driving a nonvolatile memory device of claim 1, wherein the unperformed erase operation is performed at a time without being suspended.

7. The method for driving a nonvolatile memory device of claim 1, further comprising comparing a second vacant time between a completion time point of the second operation and a start time point of a third operation with the residual time after performing the second operation, performing the unperformed erase operation if the residual time is equal to or shorter than the second vacant time, and performing the third operation if the residual time is longer than the second vacant time.

8. The method for driving a nonvolatile memory device of claim 7, further comprising adjusting the residual time after performing the second operation, wherein the comparing the second vacant time with the residual time includes comparing the second vacant time with the adjusted residual time.

9. The method for driving a nonvolatile memory device of claim 1, wherein a first block that includes the plurality of memory cells and a plurality of second blocks that are different from the first block are provided, and the first operation and the second operation are performed with respect to the plurality of second blocks.

10. The method for driving a nonvolatile memory device of claim 9, wherein the erase operation is performed in the unit of a block.

11. A method for driving a nonvolatile memory device, comprising:
    performing an erase operation with respect to a plurality of memory cells;
    stopping the erase operation by a suspend command;
    calculating a residual time of the erase operation that has not yet been performed; and
    sequentially performing first to third operations that are different from the erase operation,
    wherein if the residual time is equal to or shorter than a time between the first operation and the second operation, the erase operation that has not yet been performed is performed before the second operation is performed, while if the residual time is equal to or shorter than a time between the second operation and the third operation, the erase operation that has not yet been performed is performed before the third operation is performed.

12. The method for driving a nonvolatile memory device of claim 11, wherein the erase operation that has not yet been performed is performed by adjusting the residual time of the erase operation that has not yet been performed before the erase operation that has not yet been performed is performed.

13. The method for driving a nonvolatile memory device of claim 12, wherein the erase operation includes a plurality of unit erase operations and an optional operation, and
    the adjusting the residual time comprises adjusting the residual time by removing the optional operation.

14. The method for driving a nonvolatile memory device of claim 12, wherein if the residual time is longer than the time between the first operation and the second operation and the residual time is longer than the time between the second operation and the third operation, the erase operation that has not yet been performed is performed after the third operation is performed.

15. A nonvolatile memory device comprising:
    a memory device including a plurality of blocks each of which includes a plurality of memory cells; and
    a memory controller controlling the memory device in accordance with a request from a host,
    wherein if a suspend command is received from the host while an erase operation is performed with respect to at least one of the plurality of blocks, the memory controller stops the erase operation and calculates a residual time of the erase operation that has not yet been performed during the erase operation, and
    the memory controller sequentially performs a first operation and a second operation, compares a vacant time between the first operation and the second operation with the residual time, performs the erase operation that has not yet been performed before performing the second operation if the residual time is shorter than the vacant time, and performs the erase operation that has not yet been performed after the second operation if the residual time is longer than the vacant time,
    the erase operation that has not yet been performed is performed at a time without being stopped, and
    the memory controller adjusts the residual time.

16. The nonvolatile memory device of claim 15, wherein the first and second operations are different from the erase operation.

17. The nonvolatile memory device of claim 15, wherein among the plurality of blocks, the blocks of which the erase operation is performed are different from the blocks of which the first and second operations are performed.

* * * * *